(12) United States Patent
Yonezawa et al.

(10) Patent No.: US 10,797,595 B2
(45) Date of Patent: Oct. 6, 2020

(54) POWER SUPPLY AND CONTROL METHOD FOR POWER SUPPLY

(71) Applicant: FDK CORPORATION, Tokyo (JP)

(72) Inventors: Yu Yonezawa, Sagamihara (JP); Jun Oikawa, Tokyo (JP); Eiji Nagashima, Tokyo (JP); Yoshiyasu Nakashima, Kawasaki (JP)

(73) Assignee: FDK CORPORATION, Tokyo (JP)

( * ) Notice: Subject to any disclaimer, the term of this patent is extended or adjusted under 35 U.S.C. 154(b) by 0 days.

(21) Appl. No.: 16/518,207

(22) Filed: Jul. 22, 2019

(65) Prior Publication Data

US 2019/0341848 A1 Nov. 7, 2019

Related U.S. Application Data

(63) Continuation of application No. PCT/JP2017/045300, filed on Dec. 18, 2017.

(30) Foreign Application Priority Data

Jan. 27, 2017 (JP) ................... 2017-013474

(51) Int. Cl.
*H02M 3/156* (2006.01)
*G01R 1/20* (2006.01)
(Continued)

(52) U.S. Cl.
CPC ............ *H02M 3/156* (2013.01); *G01R 1/203* (2013.01); *G01R 19/0092* (2013.01); *G05F 1/10* (2013.01);
(Continued)

(58) Field of Classification Search
CPC ............ H02M 1/14; H02M 1/32; H02M 1/15; H02M 3/156; H02M 3/1563; H02M 3/158;
(Continued)

(56) References Cited

U.S. PATENT DOCUMENTS 5,982,160 A 11/1999 Walters et al.
8,680,821 B2 * 3/2014 Vogman ................ H02M 3/156
323/222
(Continued)

FOREIGN PATENT DOCUMENTS

JP 2000-227808 A 8/2000
JP 2003-121478 A 4/2003
(Continued)

OTHER PUBLICATIONS

Forghani-Zadeh et al., "Current-Sensing Techniques for DC-DC Converters", The 2002 45th Midwest Symposium on Circuits and Systems (MWSCAS-2002), Tulsa, OK, USA, Aug. 4-7, 2002.
(Continued)

*Primary Examiner* — Matthew V Nguyen
(74) *Attorney, Agent, or Firm* — Myers Wolin, LLC.

(57) ABSTRACT

A current detection circuit included in a power supply detects a current flowing to an inductance element from a detection tap of an inductance element connected between an output terminal and an output of a first switching element. A control circuit included in the power supply controls a first control terminal of the first switching element and a second control terminal of a second switching element and calculates an output current flowing to a load based on the current detected by the current detection circuit.

8 Claims, 16 Drawing Sheets

(51) Int. Cl.
*G01R 19/00* (2006.01)
*G05F 1/10* (2006.01)
*H02M 1/14* (2006.01)
*H02M 1/00* (2006.01)

(52) U.S. Cl.
CPC ...... *H02M 1/14* (2013.01); *H02M 2001/0009* (2013.01)

(58) Field of Classification Search
CPC ....... H02M 3/1588; H02M 2001/0009; H02M 2001/0064; G05F 1/10; G01R 1/203; G01R 19/0092
See application file for complete search history.

(56) References Cited

U.S. PATENT DOCUMENTS

| | | | | |
|---|---|---|---|---|
| 9,184,659 | B2* | 11/2015 | Song | H02M 3/1588 |
| 9,252,661 | B2* | 2/2016 | Grbo | H02M 3/1588 |
| 2003/0020592 | A1 | 1/2003 | Hirasawa | |
| 2009/0302813 | A1 | 12/2009 | Schoofs | |
| 2015/0061615 | A1* | 3/2015 | Michishita | H02M 3/1588 |
| | | | | 323/271 |
| 2017/0077813 | A1* | 3/2017 | Li | H02M 1/32 |
| 2020/0099310 | A1* | 3/2020 | Chen | H02M 3/33569 |

FOREIGN PATENT DOCUMENTS

| | | |
|---|---|---|
| JP | 2009-136139 A | 6/2009 |
| JP | 2009-537112 A | 10/2009 |
| JP | 2011-62060 A | 3/2011 |
| JP | 2015-165762 A | 9/2015 |

OTHER PUBLICATIONS

DeCarlo et al., "Linear Circuit Analysis Time Domain, Phasor, and Laplace Transform Approaches", Second Edition, 2001, pp. 140-141 Oxford University Press, New York, NY.
Ammouri et al., "Design and Modeling of Planar Magnetic Inductors for Power Converters Applications", 7th International Conference on Modelling, Identification and Control (ICMIC 2015), Sousse, Tunisia, Dec. 18-20, 2015.
Karube et al., "High-efficiency Front End Power Supplies Certified as 80 Plus", Fuji Electric Journal, vol. 85, No. 3, May 10, 2012, pp. 226-230, with English abstract.
International Search Report issued for corresponding International Patent Application No. PCT/JP2017/045300, dated Feb. 27, 2018.
Written Opinion of the International Searching Authority issued for corresponding International Patent Application No. PCT/JP2017/045300, dated Feb. 27, 2018, with a partial English translation.
Notice of Reasons for Refusal issued by Japan Patent Office dated Jun. 2, 2020 for a corresponding Japanese Patent Application No. 2017-013474, with a full English machine translation.

* cited by examiner

POWER SUPPLY AND CONTROL METHOD FOR POWER SUPPLY

CROSS-REFERENCE TO RELATED APPLICATION

This application is a continuation application of International Application PCT/JP2017/045300 filed on Dec. 18, 2017 which designated the U.S., which is based upon and claims the benefit of priority of the prior Japanese Patent Application No. 2017-013474, filed on Jan. 27, 2017, the entire contents of which are incorporated herein by reference.

FIELD

The embodiments discussed herein are related to a power supply and a control method for a power supply.

BACKGROUND

Switching power supplies, which are power supplies that include switching elements, are used in communication base stations, information processing apparatuses (such as servers), processor modules, and the like. Power supplies are conventionally controlled digitally using a control circuit, such as a microcontroller. Digital control has the advantages of precise control over the switching timing of a switching element and enabling various functions to be implemented by software.

In a power supply that uses digital control, a control circuit calculates the output current flowing to a load, and uses the calculation result to control the output voltage and to prevent an overcurrent. The output current can be calculated using the current flowing through an inductance element connected between the output terminal of a power supply circuit and a switching element.

A current detection circuit for detecting the current flowing through the inductance element may be provided with a filter circuit connected in parallel to the inductance element. The filter circuit is a series circuit composed of a resistance element and a capacitance element. The current flowing through the inductance element is detected based on the potential difference vc across both ends of the capacitance element. Here, the inductance of the inductance element is expressed as L, the equivalent series resistance (ESR) of the inductance element as RL, the resistance of the resistance element in the filter circuit as Rf, and the capacitance of the capacitance element as Cf. By using a design where L/RL=Rf·Cf, the potential difference vc becomes vc=RL·iL (where iL is the current flowing through the inductance element) and does not depend on the frequency characteristics of the inductance element. This current detection circuit can detect the current flowing through the inductance element with a small loss.

Note that one type of inductance element is a planar inductor that uses a wiring pattern formed on a printed circuit board as the winding of a coil.

See, for example, the following documents.

Japanese National Publication of International Patent Application No. 2009-537112

Japanese Laid-open Patent Publication No. 2000-227808

Japanese Laid-open Patent Publication No. 2009-136139

Hassan Pooya Forghani-zadeh et al., "Current-Sensing Techniques for DC-DC Converters", The 2002 45th Midwest Symposium on Circuits and Systems (MWSCAS-2002), 2002

Raymond A. DeCarlo et al., "Linear Circuit Analysis", Second Edition, Oxford University Press, 2001, pp. 140-141

Aymen Ammouri et al., "Design and Modeling of Planar Magnetic Inductors for Power Converters Applications", ICMIC 2015

Power supplies are also designed so that the larger the output voltage, the larger the inductance L so as to reduce the ripple current. When the inductance L is increased, Rf·Cf is increased so that the relationship L/RL=Rf·Cf is satisfied. Since increasing the capacitance value Cf would result in increased loss, the resistance Rf is increased instead. When doing so however, there is the problem that error given by the equation of the potential difference vc=RL·iL increases, so that there is deterioration in the detection accuracy of the current iL and deterioration in the calculation accuracy of the output current flowing to the load.

SUMMARY

According to one aspect, there is provided a power supply including: a first switching element that switches a current inputted from an input terminal; a second switching element that switches between a ground potential and an output of the first switching element; an inductance element that connects between an output terminal and the output of the first switching element and includes a detection terminal; a current detection circuit that detects, from the detection terminal, a current flowing through the inductance element; and a control circuit that controls a first control terminal of the first switching element and a second control terminal of the second switching element and calculates an output current flowing to a load connected to the power supply based on the current detected by the current detection circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Several embodiments will be described below with reference to the accompanying drawings.

First Embodiment

Figure 1:
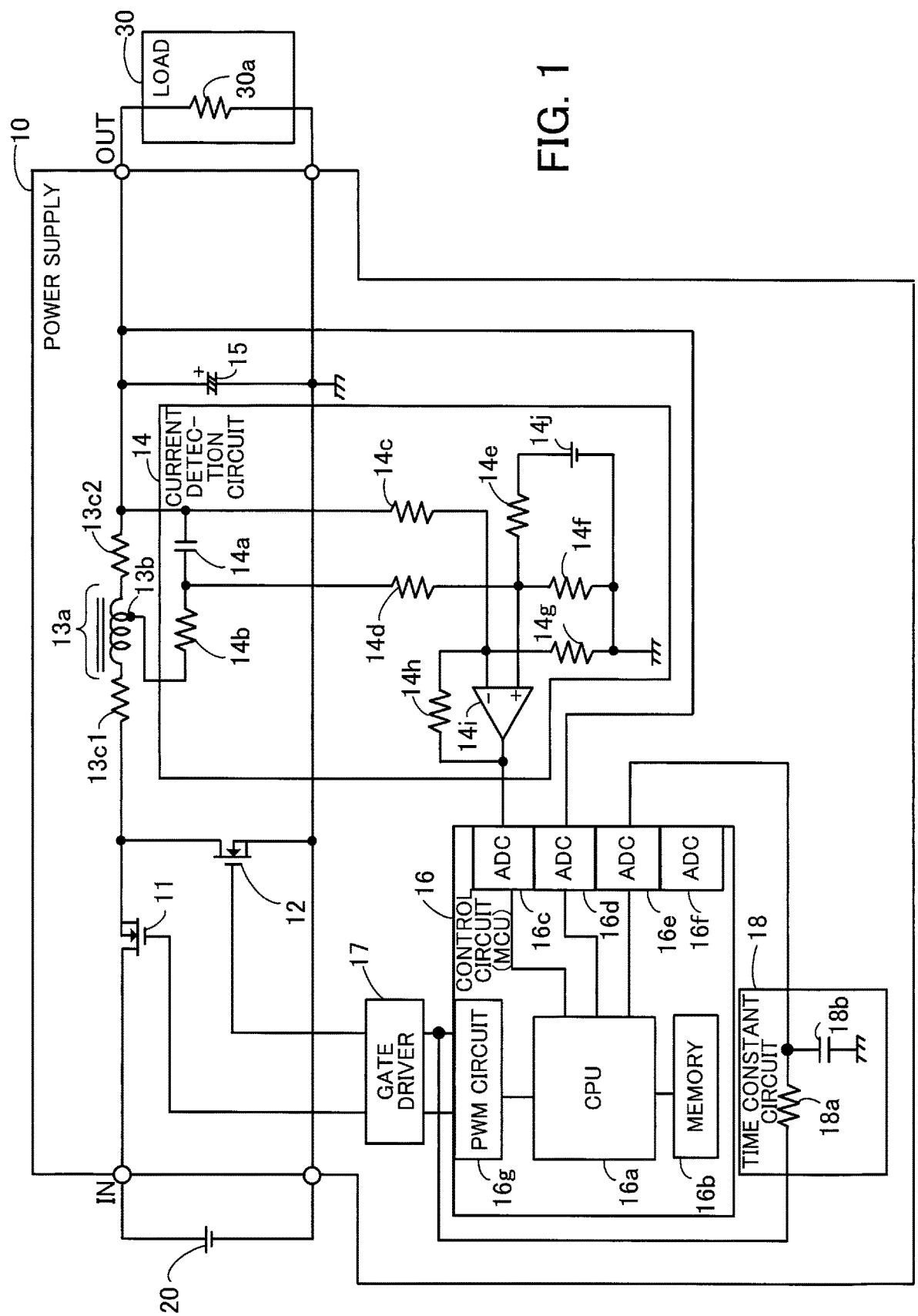
FIG. 1 depicts one example of a power supply according to a first embodiment.

FIG. 1 depicts one example of a power supply according to a first embodiment.

The power supply 10 converts the magnitude of an input voltage supplied from a power supply 20 and supplies to a load 30 with a load resistance 30a.

The power supply 10 includes switching elements 11 and 12, an inductance element 13a, a current detection circuit 14, a capacitance element 15, a control circuit 16, a gate driver 17, and a time constant circuit 18.

The switching element 11 switches a current inputted from an input terminal IN of the power supply 10. The switching element 12 switches between ground potential and the output of the switching element 11. As one example, the switching elements 11 and 12 are n-channel MOSFETs (Metal Oxide Semiconductor Field Effect Transistors).

The switching elements 11 and 12 each have two terminals and a control terminal. When constructed of n-channel MOSFETs, the two terminals of the switching elements 11 and 12 are the drain and source electrodes and the control element is the gate electrode.

One terminal of the switching element 11 is connected to the input terminal IN and the other terminal is connected to one terminal of the switching element 12 and, via an equivalent series resistance 13c1, described later, to one terminal of the inductance element 13a. The other terminal of the switching element 12 is connected to ground. Note that the ground potential is not necessarily 0V and may somewhat fluctuate. The control terminals of the switching elements 11 and 12 are connected to the gate driver 17. Note that control is performed so that when the switching element 11 is on, the switching element 12 is off, and when the switching element 11 is off, the switching element 12 is on.

The inductance element 13a is connected between an output terminal OUT of the power supply 10 and an output of the switching element 11. One end of the inductance element 13a is connected via the equivalent series resistance 13c1 to the other terminal (that is, the output terminal) of the switching element 11. The other end of the inductance element 13a is connected via an equivalent series resistance 13c2 to the output terminal OUT.

The inductance element 13a has a detection terminal (hereinafter referred to as the "detection tap") 13b. In the power supply 10 according to the first embodiment, when the number of turns in the inductance element 13a is expressed as "N", the detection tap 13b is provided at a position a number of turns Na (where N>Na) from the output terminal OUT end of the inductance element 13a. The equivalent series resistance 13c1 is an equivalent series resistance of the part on the N−Na turns-side of the inductance element 13a and the equivalent series resistance 13c2 is an equivalent series resistance of the Na turns-side of the inductance element 13a.

The current detection circuit 14 detects the current flowing in the inductance element 13a from the detection tap 13b.

The current detection circuit 14 includes a capacitance element 14a, resistance elements 14b, 14c, 14d, 14e, 14f, 14g, and 14h, an amplifier 14i, and a bias power supply 14j.

The capacitance element 14a and the resistance element 14b are connected in series and the series circuit composed of the capacitance element 14a and the resistance element 14b functions as a filter circuit. One end of this series circuit (that is, one end of the resistance element 14b) is connected to the detection tap 13b of the inductance element 13a. The other end of the series circuit (that is, one end of the capacitance element 14a) is connected via the equivalent series resistance 13c2 to one end (that is, the output terminal OUT-end) of the inductance element 13a and is also connected to one end of the resistance element 14c.

The other end of the resistance element 14c is connected to an inverting input terminal of the amplifier 14i. One end of the resistance element 14d is connected to a junction between the capacitance element 14a and the resistance element 14b and the other end of the resistance element 14d is connected to the non-inverting input terminal of the amplifier 14i. One end of the resistance element 14e is connected to the bias power supply 14j and the other end of the resistance element 14e is connected to the non-inverting input terminal of the amplifier 14i. One end of the resistance element 14f is connected to the non-inverting input terminal of the amplifier 14i and the other end of the resistance element 14f is grounded. One end of the resistance element 14g is connected to the inverting input terminal of the amplifier 14i and the other end of the resistance element 14g is grounded. One end of the resistance element 14h is connected to the output terminal of the amplifier 14i and the other end of the resistance element 14h is connected to the inverting input terminal of the amplifier 14i. Due to the connections described above, the amplifier 14i functions as a differential amplifier. The bias power supply 14j generates a bias voltage to be supplied to the amplifier 14i.

The capacitance element 15 holds the output voltage supplied to the load 30. In combination with the inductance element 13a, the capacitance element 15 functions as an LC filter which smooths the output voltage. One end of the capacitance element 15 is connected to the output terminal OUT and the other end of the capacitance element 15 is grounded.

The control circuit 16 controls the respective control terminals of the switching elements 11 and 12. The control circuit 16 also calculates the output current flowing to the load 30 based on the current of the inductance element 13a detected by the current detection circuit 14. Note that in the power supply 10 according to the first embodiment, when calculating the output current, the control circuit 16 uses an output of the time constant circuit 18, which receives an input of the control signal that controls the control terminal of the switching element 12. Note however that the control circuit 16 may calculate the output current without using the output of the time constant circuit 18.

The control circuit 16 includes a CPU (Central Processing Unit) 16a, a memory 16b, ADCs (Analog to Digital Converters) 16c, 16d, 16e, and 16f, and a PWM (Pulse Width Modulation) circuit 16g. As one example, the control circuit 16 is an MCU (Micro Control Unit).

The CPU 16a executes a program stored in the memory 16b and calculates the output current flowing to the load 30 using the output of the time constant circuit 18, the current at the inductance element 13a, and the output voltage outputted from the output terminal OUT. The CPU 16a then decides a duty ratio of switching pulses that causes the output voltage to become a target value and transmits the duty ratio to the PWM circuit 16g. The CPU 16a also determines whether the output current is an overcurrent and, when the output current is an overcurrent, transmits a stop signal to the PWM circuit 16g.

Figure 2:
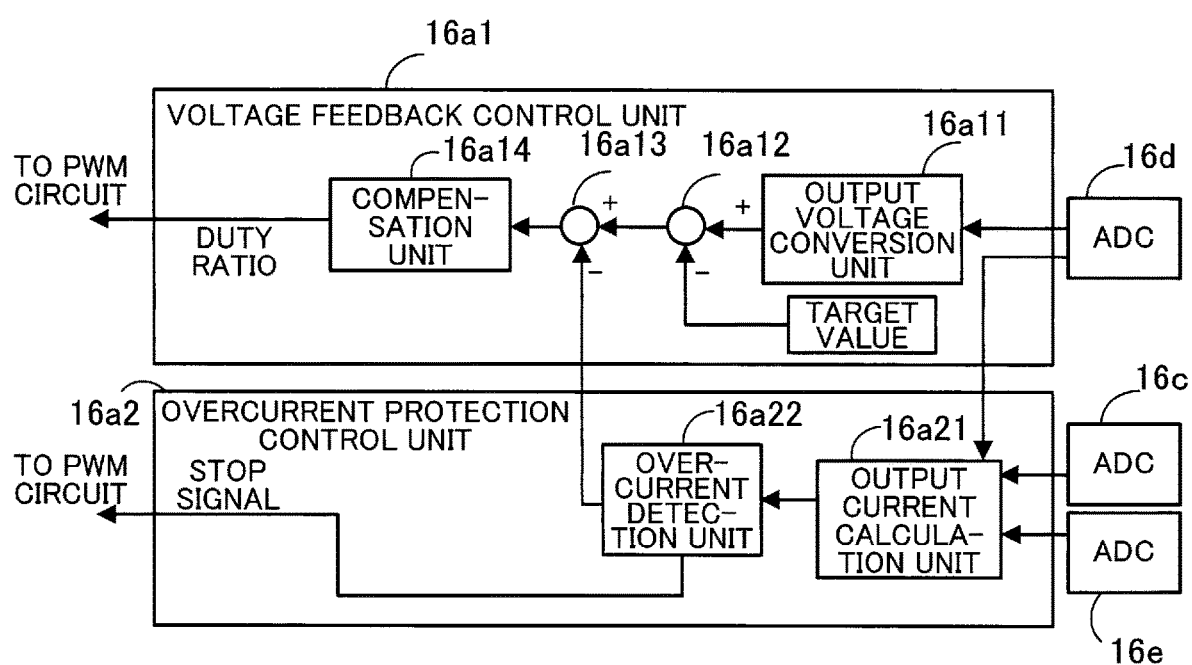
FIG. 2 is a functional block diagram depicting one example of functions of a CPU.

FIG. 2 is a functional block diagram depicting one example of the functions of the CPU.

The CPU 16a executes functions of a voltage feedback control unit 16a1 and an overcurrent protection control unit 16a2.

The voltage feedback control unit 16a1 decides and outputs the duty ratio of the switching pulses based on the difference between the output voltage of the power supply 10 and the target value and also the output of the overcurrent protection control unit 16a2.

The voltage feedback control unit 16a1 includes an output voltage conversion unit 16a11, subtraction units 16a12 and 16a13, and a compensation unit 16a14. The output voltage conversion unit 16a11 receives the result of AD conversion of the output voltage of the power supply 10 outputted by the ADC 16d and converts to an output voltage value that is handled in calculations by the CPU 16a. The subtraction unit 16a12 outputs the difference between the output voltage value and the target value. The subtraction unit 16a13 outputs a value produced by subtracting the output (or "control value", described later) of the overcurrent protection control unit 16a2 from the difference between the output voltage value and the target value. The compensation unit 16a14 decides and outputs the duty ratio based on the output of the subtraction unit 16a13.

The overcurrent protection control unit 16a2 calculates the output current of the power supply 10 based on the current flowing to the inductance element 13a detected by the current detection circuit 14 and determines whether the output current is an overcurrent. When the output current is an overcurrent, the overcurrent protection control unit 16a2 then outputs a control value for stopping the PWM circuit 16g or reducing the magnitude of the output voltage.

The overcurrent protection control unit 16a2 includes an output current calculation unit 16a21 and an overcurrent detection unit 16a22. The output current calculation unit 16a21 calculates the output current based on the result of AD conversion of the result of current detection by the current detection circuit 14 which is outputted by the ADC 16c, the result of AD conversion of the output voltage outputted by the ADC 16d, and the result of AD conversion of the output of the time constant circuit 18 outputted by the ADC 16e. The overcurrent detection unit 16a22 determines whether the output current is an overcurrent. When the output current is an overcurrent, the overcurrent detection unit 16a22 outputs a control value for stopping the PWM circuit 16g or reducing the magnitude of the output voltage.

The description now returns to FIG. 1.

The memory 16b stores a program to be executed by the CPU 16a and various data.

The ADCs 16c to 16f convert input signals of the control circuit 16 into digital signals and supply the digital signals to the CPU 16a. In the example of FIG. 1, the ADC 16c subjects the current detection result outputted from the current detection circuit 14 to AD conversion and outputs the result. The ADC 16d subjects the output voltage, which is analog, to AD conversion and outputs the result. The ADC 16e subjects the output of the time constant circuit 18, which is analog, to AD conversion and outputs the result. Note that the ADC 16f may be omitted.

The PWM circuit 16g is one example of a gate control circuit, and outputs control signals (or "gate control signals") for the switching elements 11 and 12 to cause the switching elements 11 and 12 to perform switching operations based on the duty ratio supplied from the CPU 16a.

The gate driver 17 outputs, based on control signals outputted from the control circuit 16, control voltages (for example, gate voltages of n-channel MOSFETs) to be supplied to the respective control terminals of the switching elements 11 and 12.

The time constant circuit 18 functions as an integration circuit (or low pass filter), and outputs an output produced by filtering the control signal for controlling the switching element 12. The time constant circuit 18 includes a resistance element 18a that receives the control signal described above at one end, and a capacitance element 18b that is connected at one end to the other end of the resistance element 18a. The other end of the resistance element 18a is also connected to the ADC 16e of the control circuit 16, and the other end of the capacitance element 18b is grounded.

Example of Inductance Element 13a

A planar inductor can be used as the inductance element 13a depicted in FIG. 1.

Figure 3:
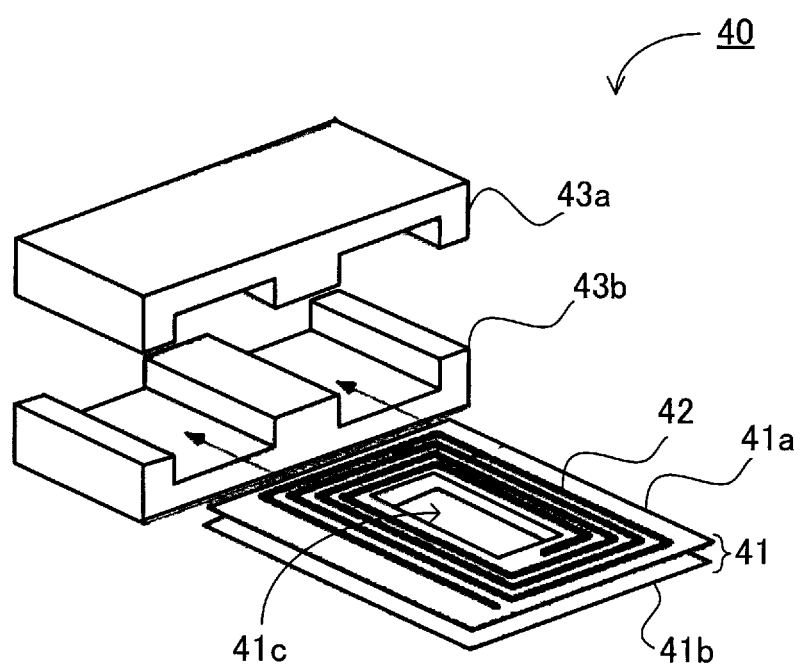
FIG. 3 is a perspective view depicting an example of a planar inductor.

FIG. 3 is a perspective view depicting an example of a planar inductor.

The planar inductor 40 has a wiring pattern 42 formed as a coil on a substrate 41, and core members 43a and 43b, such as ferrite cores.

When the coil has a large number of turns, the wiring pattern 42 is formed across a plurality of layers (the two layers 41a and 41b in the example in FIG. 3) of the substrate 41 using vias, not illustrated.

The core members 43a and 43b are provided so as to sandwich the substrate 41. The substrate 41 is provided with an opening 41c, and convex parts of the core members 43a and 43b come into contact at the opening 41c.

The inductance element 13a of the power supply 10 according to the first embodiment is realized by providing a detection tap on the planar inductor as described above.

Figure 4:
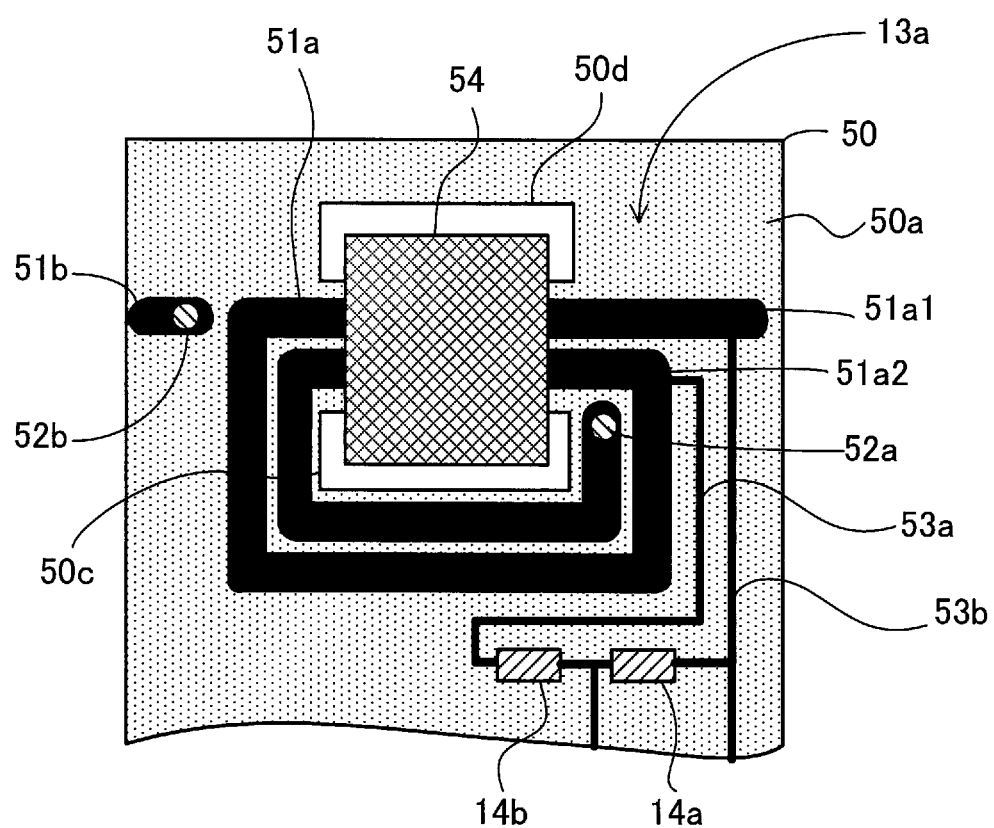
FIG. 4 is a first plan view depicting an example of an inductance element in the power supply according to the first embodiment.
Figure 5:
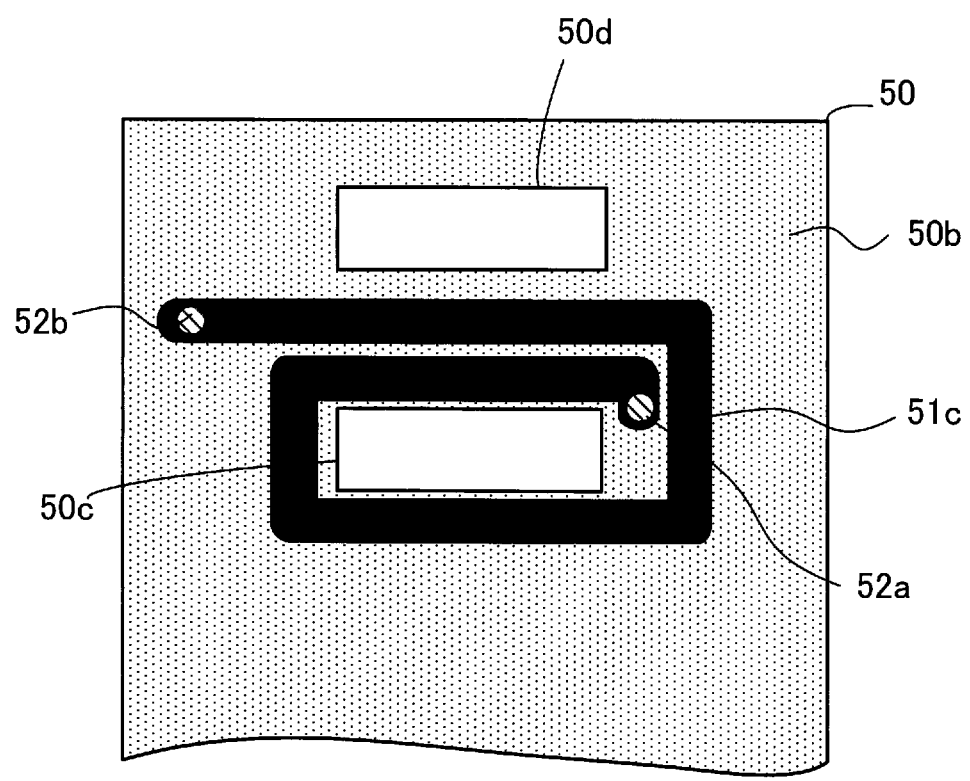
FIG. 5 is a second plan view depicting an example of an inductance element in the power supply according to the first embodiment.

FIG. 4 and FIG. 5 are plan views depicting an example of an inductance element in the power supply according to the first embodiment.

The current detection circuit 14 depicted in FIG. 1 is mounted on the circuit board 50. In FIG. 4, the capacitance element 14a and the resistance element 14b that are elements of the current detection circuit 14 are depicted. The inductance element 13a is also mounted on the circuit board 50.

As depicted in FIGS. 4 and 5, the coil of the inductance element 13a is realized by wiring patterns 51a, 51b, 51c that are internal wiring of two layers 50a and 50b of the circuit board 50. The wiring pattern 51a formed on the layer 50a is connected to one end of the wiring pattern 51c of the layer 50b via a via 52a that is connected to one end of the wiring pattern 51a. The wiring pattern 51c of the layer 50b is connected to the wiring pattern 51b of the layer 50a via a via 52b that is connected to the other end of the wiring pattern

51c. The wiring pattern 51b corresponds to one end (the switching elements 11 and 12 end) of the equivalent series resistance 13c1 in FIG. 1, and an end 51a1 of the wiring pattern 51a corresponds to one end (the output terminal OUT end) of the equivalent series resistance 13c2 in FIG. 1.

The number of turns in the inductance element 13a in FIG. 4 is three, and in the wiring pattern 51a, a one-turn part 51a2 from the end 51a1 is connected via a wiring pattern 53a to one end of the resistance element 14b of the current detection circuit 14. This part 51a2 corresponds to the detection tap 13b.

Likewise, in the wiring pattern 51a, the end 51a1 is connected via a wiring pattern 53b to one end of the capacitance element 14a of the current detection circuit 14.

The inductance element 13a has a core member 54, such as a ferrite core. The core member 54 is provided so as to pass through openings 50c and 50d provided in the circuit board 50 and cover part of the wiring pattern 51a.

Method of Calculating Output Current

As one example, the output current calculation unit 16a21 in FIG. 2 calculates the output current Iout based on Equation (1) below.

$$Iout = Ipeak - (1 - Vo/E) \cdot k \cdot Vo \tag{1}$$

In Equation (1), Ipeak is the peak current which is a peak value of the current flowing through the inductance element 13a. Vo is the output voltage and E is the input voltage. Also, $k = (\frac{1}{2}) \cdot (1/L) \cdot (1/fsw)$, L is the inductance of the inductance element 13a, and fsw is the switching frequency. Note that k is stored in advance in the memory 16b, for example.

The peak current Ipeak is obtained as follows.

The result of current detection outputted by the current detection circuit 14 is expressed as a voltage value (hereinafter referred to as "a voltage Vsense"). The voltage Vsense is based on the current iL flowing through the inductance element 13a. The ADC 16c performs AD conversion at timing where the voltage Vsense hits a peak. The output current calculation unit 16a21 calculates a peak current Ipeak by dividing the result of AD conversion by the resistance of the equivalent series resistance 13c2 and the amplification factor A of the amplifier 14i.

Since the power supply 10 according to the first embodiment includes the inductance element 13a equipped as described above with the detection tap 13b, the detection accuracy of the current iL is improved. This means it is possible to calculate the peak current Ipeak with high accuracy, which in turn makes it possible to accurately calculate the output current Iout.

The reasons behind this will now be described by way of a comparative example of a power supply.

Figure 6:
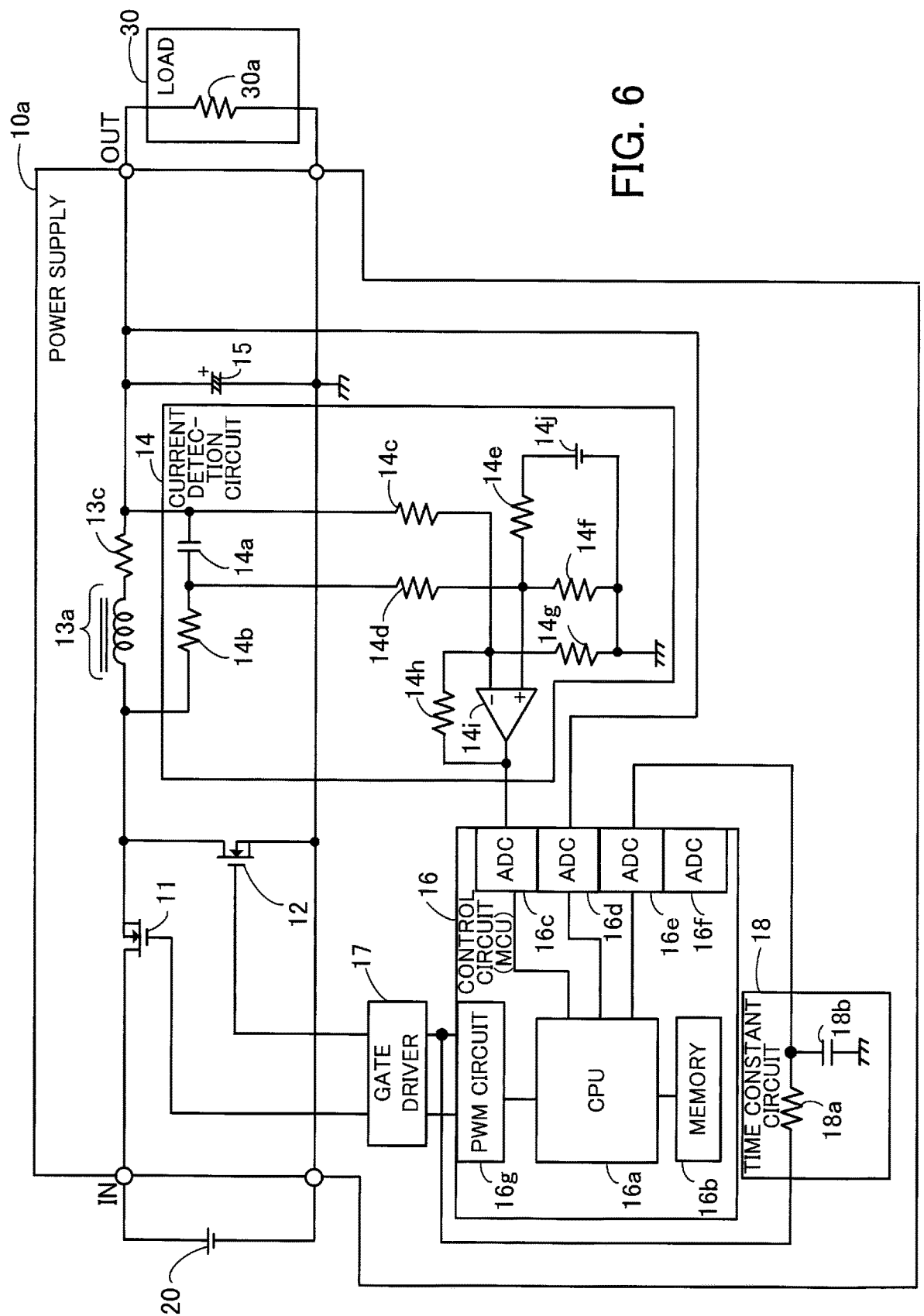
FIG. 6 depicts a power supply that is a comparative example.

FIG. 6 depicts a power supply that is a comparative example. Elements in FIG. 6 that are the same as in FIG. 1 have been assigned the same reference numerals.

In the power supply 10a that is the comparative example, a series circuit composed of the capacitance element 14a and the resistance element 14b is connected in parallel to the inductance element 13a.

In this power supply 10a, the potential difference vc across both ends of the capacitance element 14a can be expressed by Equation (2) below.

$$vc = RL\{(1+sT)/(1+sT1)\}iL \tag{2}$$

In Equation (2), RL is the resistance of an equivalent series resistance 13c of the inductance element 13a and s is a symbol representing a Laplace conversion. T and T1 are defined as T=L/RL and T1=Rf·Cf. L is the inductance of the inductance element 13a, Rf is the resistance of the resistance element 14b, and Cf is the capacitance of the capacitance element 14a.

In Equation (2), by using a design that results in T=T1, the potential difference Vc becomes vc=RL·iL, which avoids any dependency on the frequency characteristics of the inductance element 13a.

At this time, the voltage Vsense that is the result of current detection outputted by the amplifier 14i can be expressed by Equation (3) below.

$$Vsense = A \cdot RL \cdot iL \tag{3}$$

In Equation (3), A is the amplification factor of the amplifier 14i.

In the power supply 10a that is the comparative example, the control circuit 16 calculates the peak current Ipeak that is the peak of the current iL based on Equation (3) and calculates the output current Iout based on Equation (1).

However, in the power supply 10a that is the comparative example, when the inductance L increases, the voltage Vsense deviates from the value obtained by Equation (3) given above.

When the inductance L increases, the resistance Rf or the capacitance Cf may be increased to satisfy the relationship of T=T1, that is, L/RL=Rf·Cf. However, an increase in the capacitance Cf results in an increased loss. The loss Prf can be expressed by Equation (4) below.

$$Prf = 0.5 Cf \cdot E^2 \cdot fsw \tag{4}$$

In Equation (4), fsw is the switching frequency of the power supply 10a. As should be clear from Equation (4), the loss Prf increases in proportion to the capacitance Cf.

On the other hand, when the resistance Rf is increased, the voltage Vsense deviates from the value obtained by Equation (3) given above for the reason described below.

The effect on the operating point of the amplifier 14i when the resistance Rf has increased will now be described.

Figure 7:
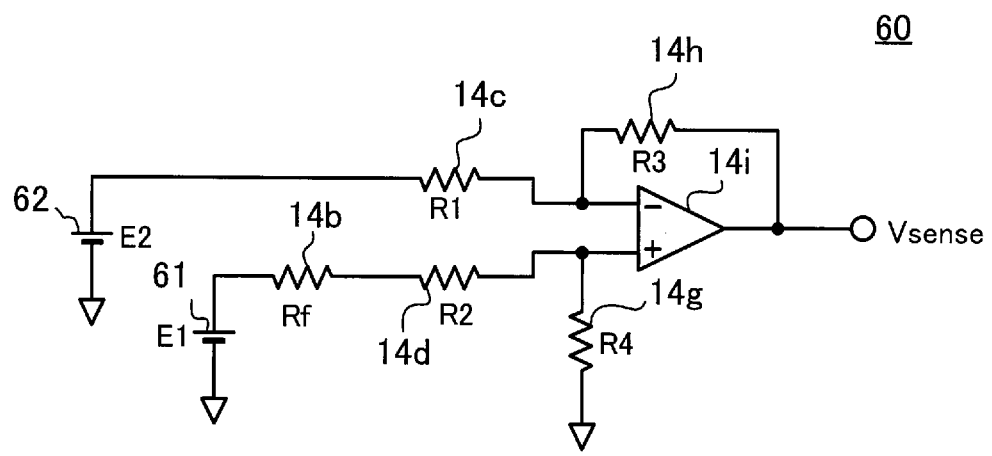
FIG. 7 depicts an equivalent circuit of a current detection circuit that considers a DC operating point.

FIG. 7 depicts an equivalent circuit of a current detection circuit that considers the DC operating point. In FIG. 7, elements that are the same as in the current detection circuit 14 depicted in FIG. 6 are assigned the same reference numerals.

In the equivalent circuit 60, a voltage E1 supplied by a power supply 61 connected to one end of the resistance element 14b represents an input voltage E supplied by the power supply in FIG. 6. The voltage E2 supplied by a power supply 62 connected to one end of the resistance element 14c represents the output voltage Vo of the power supply 10a.

Note that the respective resistances of the resistance elements 14b, 14c, 14d, 14g, and 14h are labeled in FIG. 7. The resistance of the resistance element 14b is Rf, the resistance of the resistance element 14c is R1, the resistance of the resistance element 14d is R2, the resistance of the resistance element 14g is R4, and the resistance of the resistance element 14h is R3.

When it is assumed that G1=1/R1, G2=1/R2, G3=1/R3, G4=1/R4, and G2f=1/(R2+Rf), the voltage Vsense is calculated as described below, based on the calculation method given for example on pages 140 and 141 of "Linear Circuit Analysis".

First, it is assumed that the currents flowing into the inverting input terminal and the non-inverting input terminal of the amplifier 14i are zero and the input voltage $V_+$ of the non-inverting input terminal of the amplifier 14i and the input voltage $V_-$ of the inverting input terminal are equal. At this time, the sum of the currents on the non-inverting input terminal side can be expressed by Equation (5) below.

$$G2f(V_+ - E1) + G4 \cdot V_+ = 0 \quad (5)$$

From Equation (5), $V_+$ can be expressed by Equation (6) below.

$$V_+ = G2f \cdot E1/(G2f + G4) \quad (6)$$

On the other hand, using $V_- = V_+$, the sum of the currents on the inverting input terminal side can be expressed by Equation (7) below.

$$G1(V_+ - E2) + G3(V_+ - V\text{sense}) = 0 \quad (7)$$

From Equation (7), the voltage Vsense is expressed by Equation (8) below.

$$V\text{sense} = (-G1 \cdot E2/G3) + \{1 + (G1/G3)\}V_+ \quad (8)$$

When Equation (6) is substituted into Equation (8), Equation (8) can be expressed as Equation (9) below.

$$V\text{sense} = \{1 + (R3/R1)\}\{R4/(R4 + R2 + Rf)\}E1 - R3 \cdot E2/R1 \quad (9)$$

In Equation (9), when the amplification factor (gain) A of the amplifier 14i is used and it is assumed that R1=R2, R3=R4, and R1=R3/A, Equation (9) can be expressed by Equation (10) below.

$$V\text{sense} = A\{E1(R2/(R2 + Rf(1 - A))) - E2\} \quad (10)$$

From Equation (10), when the resistance Rf is sufficiently lower than the resistance R2, the voltage Vsense can be approximated by Equation (11) below.

$$V\text{sense} = A(E1 - E2) \quad (11)$$

In Equation (11), E1−E2 corresponds to RL·iL in Equation (3).

When the resistance Rf increases, the voltage Vsense is no longer approximated by Equation (11) (or Equation (3)). That is, the voltage Vsense deviates from the value obtained by Equation (3) given above.

As one example, when L=1 μH, RL=10 mΩ, and Cf=0.1 μF, Rf=1 kΩ. When it is assumed that R2=100 kΩ and A=10, the voltage Vsense is calculated from Equation (10) as indicated in Equation (12) below.

$$V\text{sense} = 10\{E1(100 \times 10^3/(100 \times 10^3 + 1 \times 10^3(1 - 10))) - E2\} \quad (12)$$

From Equation (12), the voltage Vsense is approximately 10 (1.1E1−E2) and the voltage E1 is multiplied by a factor of 1.1. That is, the voltage Vsense outputted from the amplifier 14i has an error corresponding to a deviation of close to 10% of the voltage E1 from the voltage Vsense obtained by Equation (11).

This means that with the power supply 10a that is the comparative example, the detection error for the current iL is relatively large, so that even when the control circuit 16 calculates the peak current Ipeak, which is the peak value of the current iL, based on Equation (3), an accurate value is not obtained and the calculation accuracy of the output current Iout is also poor. When the calculation accuracy of the output current Iout is poor, the overcurrent detection unit 16a22 will not be able to correctly calculate the overcurrent.

Compared to the power supply 10a that is a comparative example, with the power supply 10 according to the first embodiment depicted in FIG. 1, the output current Iout can be accurately calculated for the reason described below.

The inductance element 13a of the power supply 10 is split into the equivalent of two inductors by the detection tap 13b.

Figure 8:
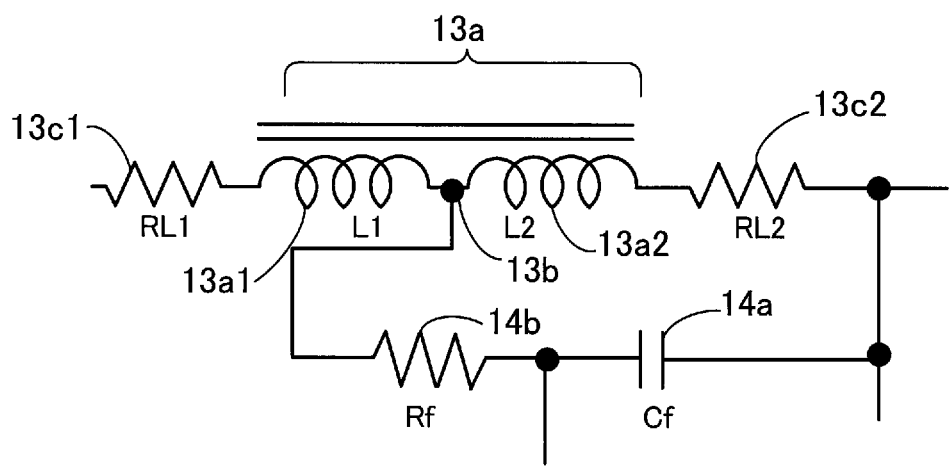
FIG. 8 depicts an equivalent circuit of connections between the inductance element and the current detection circuit in the power supply according to the first embodiment.

FIG. 8 depicts an equivalent circuit of connections between the inductance element and the current detection circuit in the power supply according to the first embodiment. In FIG. 8, elements that are the same as in FIG. 1 have been assigned the same reference numerals.

In the equivalent circuit 70, the inductance element 13a is split into two inductors 13a1 and 13a2. The point where the inductance element 13a is split corresponds to the detection tap 13b. The inductance of the inductor 13a1 is L1, and the inductance of the inductor 13a2 is L2. FIG. 8 also depicts an equivalent series resistance 13c1 of the inductor 13a1 and an equivalent series resistance 13c2 of the inductor 13a2. The resistance of the equivalent series resistance 13c1 is RL1, and the resistance of the equivalent series resistance 13c2 is RL2. FIG. 8 also depicts the capacitance element 14a and the resistance element 14b of the current detection circuit 14. The capacitance of the capacitance element 14a is Cf and the resistance of the resistance element 14b is Rf.

It is assumed that the number of turns in the entire inductance element 13a is N, the number of turns in the inductor 13a2 is Na, and the number of turns in the inductor 13a1 is N−Na. It is also assumed that the inductance of the inductance element 13a is L. The resistance of the equivalent series resistance of the entire inductance element 13a is assumed to be RL. When this is the case, the inductance L2 and the resistance RL2 can be expressed by Equations (13) and (14) below.

$$L2 = L \cdot Na^2/N^2 \quad (13)$$

$$RL2 = RL \cdot Na/N \quad (14)$$

The following relationship is obtained from Equations (13) and (14).

$$(Na/N) \cdot (L/RL) = Rf \cdot Cf \quad (15)$$

With the power supply 10a that is the comparative example, as described earlier, the resistance Rf and the capacitance Cf are set so as to produce the relationship T=T1, that is, L/RL=Rf·Cf. On the other hand, with the power supply 10 according to the first embodiment, as should be clear from Equation (15), it is sufficient for Rf·Cf to be Na/N times L/RL. When this is the case, by setting the position of the detection tap 13b so as to satisfy the relationship Na<N, it is possible to make Rf·Cf lower than in the power supply 10a that is the comparative example.

This means that even when the inductance L increases, the increase in the resistance Rf is suppressed, which suppresses increases in deviation from the voltage Vsense obtained by Equation (3) or Equation (11).

As one example, when N=10, Na=1, L=1 μH, RL=10 mΩ, and Cf=0.1 μF, the left side of Equation (15) is $(Na/N) \cdot (L/RL) = (1/10) \cdot (1 \times 10^{-6}/10 \times 10^{-3}) = 10 \times 10^{-6}$.

As one example, assume that Cf=0.047 μF and Rf=220Ω so that the right side of Equation (15) becomes $10 \times 10^{-6}$. At this time, when it is assumed that the resistance R2 of the resistance element 14d is 100 kΩ and the amplification factor A of the amplifier 14i is 10 in the same way as the conditions used for the power supply 10a that is the comparative example, the voltage Vsense is calculated as indicated by Equation (16) below.

$$V\text{sense} = 10\{E1(100 \times 10^3/(100 \times 10^3 + 220 \times 10^3(1 - 10))) - E2\} \quad (16)$$

From Equation (16), the voltage Vsense is approximately 10 (1.02E1−E2), so that the voltage E1 is multiplied by a factor of 1.02. This means that compared to the voltage Vsense calculated by Equation (12) for the power supply 10a that is the comparative example, the proportion by which the voltage E1 appears to rise can be reduced to 1/5.

The above means that with the power supply 10, the detection error for the current iL is small, and the accuracy with which the control circuit 16 calculates the peak current Ipeak, which is the peak value of the current iL, based on Equation (3) is higher than when the power supply 10a that is the comparative example is used. Accordingly, there is less deterioration in the calculation accuracy of the output current Iout when the inductance L increases. Since the output current Iout can be accurately found, the overcurrent detection unit 16a22 is also capable of correctly calculating the overcurrent.

Additionally, compared to the power supply 10a that is the comparative example, the capacitance Cf can be reduced, which reduces the loss.

As in the example described earlier, when L=1 μH and RL=10 mΩ, to satisfy the relationship T=T1, in the power supply 10a that is the comparative example, the capacitance Cf and the resistance Rf are decided so that Cf·Rf is $100 \times 10^{-6}$. When it is assumed that the resistance Rf is 1 kΩ as described earlier, the capacitance Cf becomes 0.1 μF. When it is assumed that the input voltage E is 12 V and the switching frequency fsw is 200 kHz, the loss Prf expressed by Equation (4) is Prf=$0.5 \times 0.1 \times 10^{-6} \times 12^2 \times 200 \times 10^3$=1.44 (W), so that a loss of 1.44 W occurs at the resistance element 14b.

On the other hand, with the power supply 10 according to the first embodiment, when Cf=0.047 μF and Rf=220Ω under the conditions described above, the loss Prf expressed by Equation (4) is Prf=$0.5 \times 0.47 \times 10^{-6} \times 12^2 \times 200 \times 10^3$=0.68 (W). That is, the loss at the resistance element 14b can be reduced to ½ or lower compared to the power supply 10a that is the comparative example.

As described earlier, the output current Iout is calculated based on Equation (1).

Equation (1) includes two multiplications, one division, and two subtractions.

In the power supply 10 according to the present embodiment, (1−Vo/E) included in Equation (1) is generated by the time constant circuit 18.

The reason why (1−Vo/E) is obtained by the time constant circuit 18 will now be described.

Figure 9:
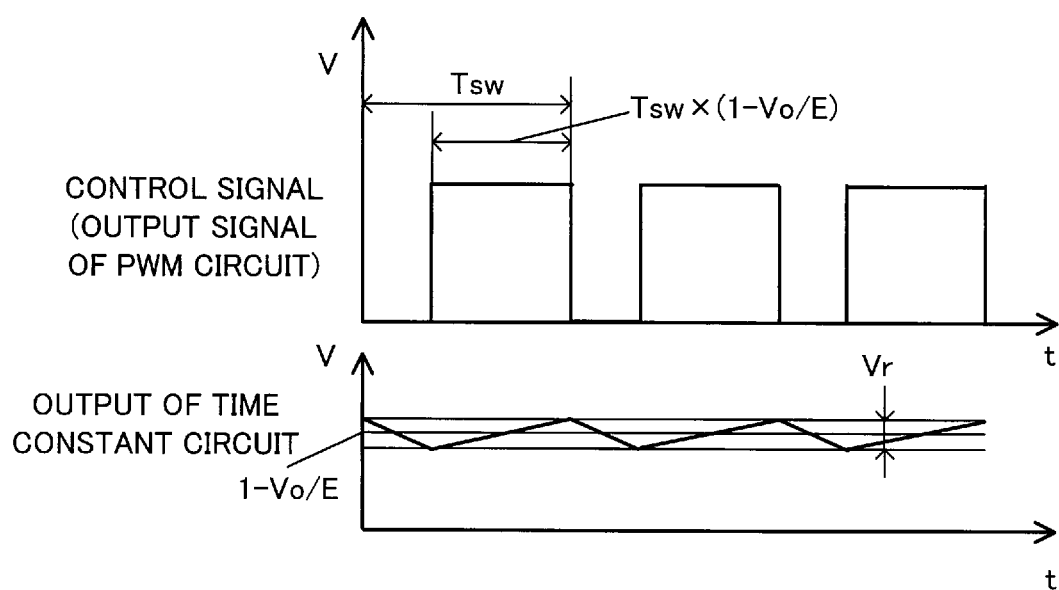
FIG. 9 depicts examples of a control signal outputted by a PWM circuit and an output of a time constant circuit.

FIG. 9 depicts examples of a control signal outputted by a PWM circuit and an output of a time constant circuit. The vertical axis represents voltage V and the horizontal axis represents time t.

FIG. 9 depicts an example of the control signal for the switching element 12 outputted from the PWM circuit 16g and the output of the time constant circuit 18. In FIG. 9, Tsw is the switching cycle. Vr is a ripple voltage of the output of the time constant circuit 18.

In the following description, it is assumed that the switching element 12 is turned on when the control signal is at an H (High) level (for example, 1 V) and the switching element 12 is turned off when the control signal is at an L (Low) level (for example, 0 V).

The switching pulse width Ton1 of the switching element 12, that is, the time for which the switching element 12 is turned on, can be expressed by Equation (17) below in the step-down power supply 10.

$$Ton1=(1-D) \cdot Tsw \quad (17)$$

In Equation (17), D is the duty ratio of the switching pulses. Since Vo=D×E, D=Vo/E. Accordingly, Equation (17) can be expressed as Equation (18) below.

$$Ton1=(1-Vo/E) \cdot Tsw \quad (18)$$

When a control signal with the switching pulse width Ton1 given by Equation (18) is inputted into the time constant circuit 18, a value close to the DC component of the control signal (that is, the average value of the control signal) is obtained by the low pass filter function. The average value of the control signal is a value obtained by dividing the integral of the control signal during a period with the switching pulse width Ton1 by the switching cycle Tsw. When it is assumed that the amplitude of the control signal is 1 V, since the integral is equal to Ton1 in Equation (18), dividing Ton1 by the switching cycle Tsw results in an average value of 1−Vo/E.

That is, a value close to 1−Vo/E is obtained as the output of the time constant circuit 18.

In the example in FIG. 9, the ripple voltage Vr is generated in the output of the time constant circuit 18. As the ripple voltage Vr increases, fluctuations in the calculated output current also increase. For this reason, it is desirable to suppress the fluctuations in the output current to or below the current detection resolution of the control circuit 16. It is therefore desirable for the ripple voltage Vr to satisfy Equation (19) below.

$$Vr<(Ireso/Imax) \cdot Vfs \quad (19)$$

In Equation (19), Ireso represents the minimum resolution of a current that can be recognized by the control circuit 16. Imax represents the maximum value of a current that can be recognized by the control circuit 16. Ireso and Imax are decided in accordance with the specification of the power supply 10.

As one example, when the power supply 10 is specified to suppress the overcurrent to within a range of 0.1 A over the rated current, Ireso is set at a value smaller than 0.1 A (for example, 0.01 A). Note that this value corresponds to the value expressed by the LSB (Least Significant Bit) of the data normally produced when the control circuit 16 performs A/D conversion.

As one example, when the power supply 10 is specified for a maximum current of 100 A, Imax is set to a value a suitable margin above 100 A, such as 120 A. Note that this value corresponds to a value indicated by the MSB (Most Significant Bit) of the data normally produced when the control circuit 16 performs A/D conversion.

In Equation (19), Vfs is the full scale of the detection voltage.

An attenuation G that enables the time constant circuit 18 to attenuate the ripple voltage Vr so as to satisfy Equation (19) is expressed as Equation (20) below.

$$G=20 \log_{10}((Ireso/Imax) \cdot Vfs) \text{ [dB]} \quad (20)$$

A cut-off frequency fc that realizes the attenuation G can be expressed as Equation (21) below.

$$fc=fsw/(G/10^{-20}) \text{ [Hz]} \quad (21)$$

The resistance of the resistance element 18a of the time constant circuit 18 and the capacitance of the capacitance element 18b are decided according to Equation (21).

As one example, it is assumed that Ireso=1 A, Imax=100 A, Vfs=1 V, and fsw=200 kHz. Here, according to Equation (20), G=20 $\log_{10}$(1/100·1)=−40 [dB], and according to Equation (21), fc=$200 \times 10^3 / (-40/10^{-20})$=2000 [Hz]. As one example, when the capacitance Cf of the capacitance element 18b is assumed to be 3300 μF, the resistance Rt of the resistance element 18a is given by Equation (22) below.

$$Rf=\frac{1}{2\pi fcCf}=1/(2\pi \times 2000 \times 3300 \times 10^{-12})=24114 [\Omega] \quad (22)$$

This means that a resistance element 18a with a resistance Rf of approximately 24 kΩ may be used.

When it is assumed that (1−Vo/E), which as described above is the output of the time constant circuit 18, is α1, Equation (1) can be expressed as Equation (23) below.

$$Iout = Ipeak - \alpha 1 \cdot k \cdot Vo \quad (23)$$

Note that when the amplitude VA of the control signal outputted from the PWM circuit 16g is not 1 V, since a value obtained by multiplying the amplitude VA by (1−Vo/E) is outputted from the time constant circuit 18, α1 becomes α1=VA(1−Vo/E).

Example Operation of Power Supply According to First Embodiment

Figure 10:
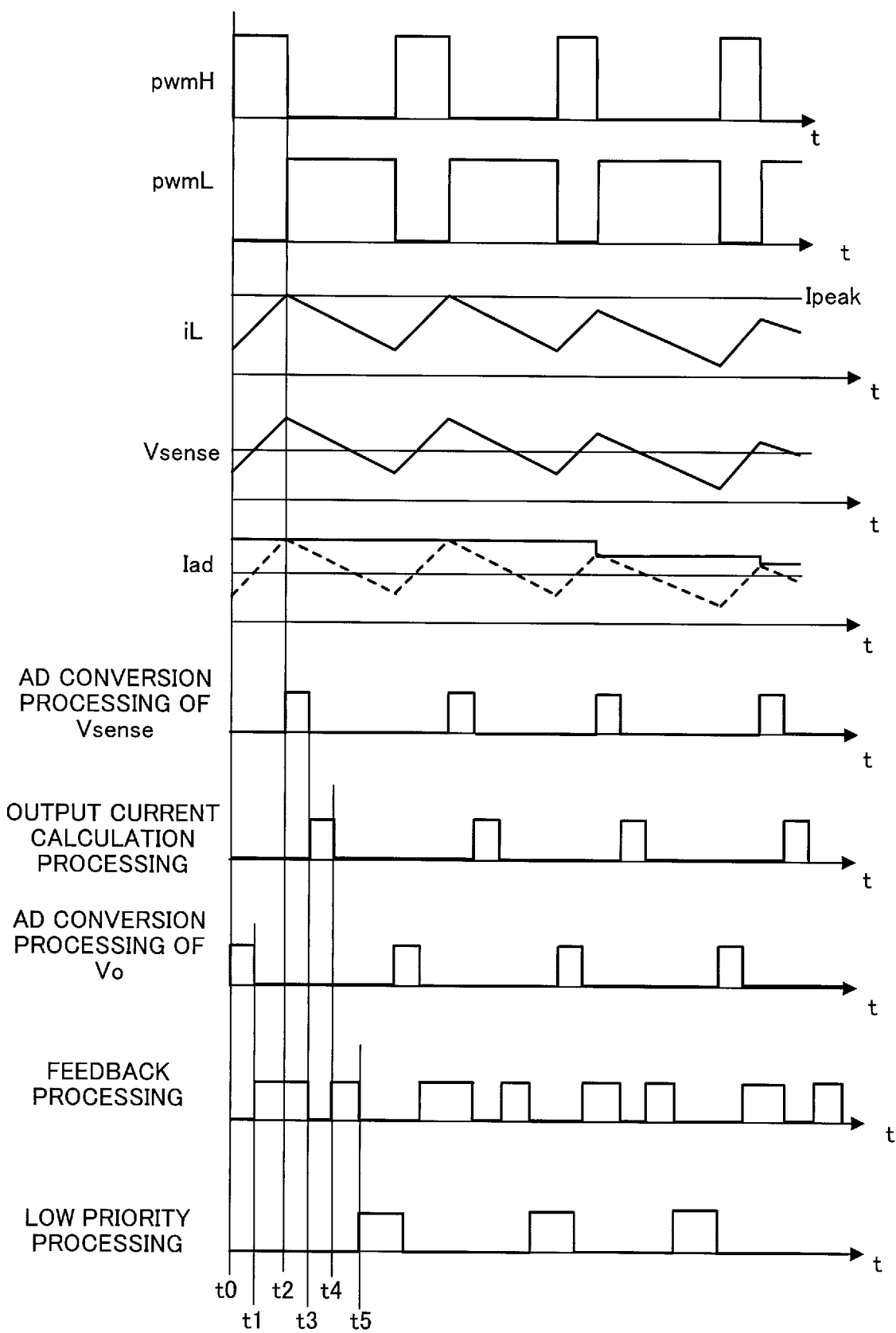
FIG. 10 is a timing chart depicting an example operation of the power supply according to the first embodiment.

FIG. 10 is a timing chart depicting an example operation of the power supply according to the first embodiment.

FIG. 10 depicts an example of how the control signal pwmH for the switching element 11 outputted from the PWM circuit 16g, the control signal pwmL for the switching element 12 outputted from the PWM circuit 16g, and the current iL flowing through the inductance element 13a change over time. Example changes over time in the voltage Vsense outputted from the current detection circuit 14 and the result Iad of AD conversion of the voltage Vsense by the ADC 16c are also depicted. In addition, examples of operation timing of AD conversion processing of the voltage Vsense, calculation processing for the output current, AD conversion processing of the voltage (the "output voltage Vo"), feedback processing, and low priority processing are depicted.

The control signal pwmH and the control signal pwmL have a phase difference of 180°. The current iL starts to rise when the control signal pwmH rises to the H level (for example, 1 V) and starts to fall when the control signal pwmH falls to the L level (for example, 0 V). The voltage Vsense at certain timing can be closely approximated by Equation (3) and is proportional to the current iL at that timing.

When the control signal pwmH rises to the H level (timing t0), AD conversion processing of the voltage (the output voltage Vo) by the ADC 16d starts. When the AD conversion processing ends (timing t1), feedback processing (duty ratio adjustment processing) by the voltage feedback control unit 16a1 depicted in FIG. 2 is performed.

When the control signal pwmH falls to the L level (timing t2), AD conversion processing of the voltage Vsense by the ADC 16c starts. When the AD conversion processing subsequently ends (timing t3), the calculation processing of the output current described earlier by the output current calculation unit 16a21 starts. During the calculation processing of the output current, feedback processing is interrupted. That is, calculation of the output current is performed with priority over the feedback processing.

When the calculation processing of the output current ends (timing t4), the feedback processing is restarted. When the feedback processing ends (timing t5), the control circuit 16 performs the low priority processing (for example, communication processing that uses a communication interface, not illustrated). After this, the same processing is repeated.

Figure 11:
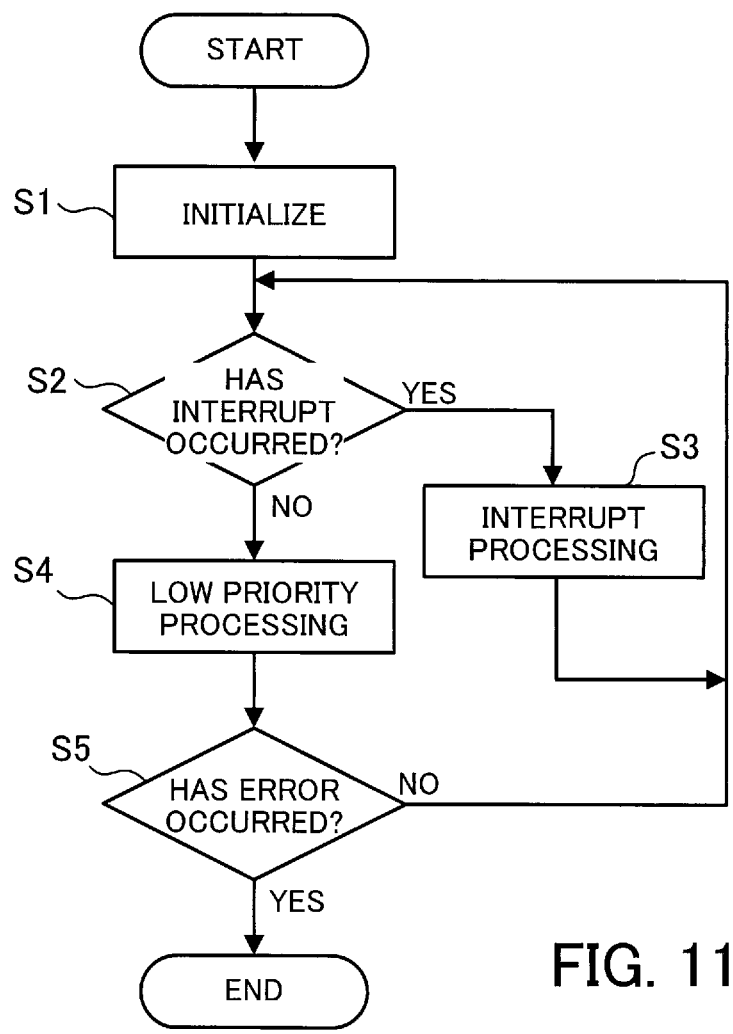
FIG. 11 is a first flowchart depicting the flow of an example operation of the power supply according to the first embodiment.
Figure 12:
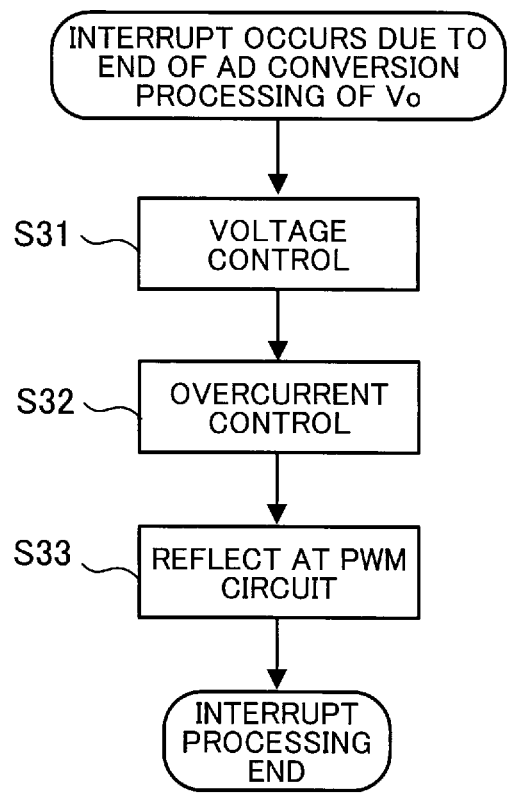
FIG. 12 is a second flowchart depicting the flow of an example operation of the power supply according to the first embodiment.
Figure 13:
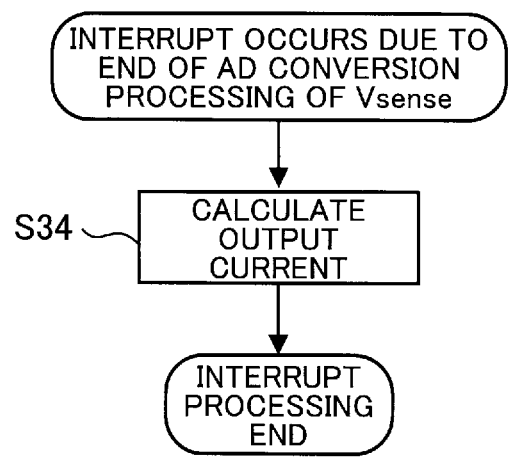
FIG. 13 is a third flowchart depicting the flow of an example operation of the power supply according to the first embodiment.

FIG. 11, FIG. 12, and FIG. 13 are flowcharts depicting the flow of an example operation of the power supply according to the first embodiment.

As depicted in FIG. 11, the CPU 16a first performs initialization of the duty ratio and the like (step S1), and then determines whether an interrupt has occurred (step S2). An interrupt occurs at the end of AD conversion processing of the voltage Vsense or the output voltage Vo depicted in FIG. 10.

When an interrupt has occurred, the CPU 16a performs the interrupt processing (step S3), and then repeats the processing from step S2. When an interrupt has not occurred, the CPU 16a performs the low priority processing (step S4). After this, the CPU 16a determines whether an error has occurred (step S5). When an error has occurred, the processing ends. When an error has not occurred, the processing from step S2 is repeated.

As depicted in FIG. 12, when an interrupt has occurred due to the end of AD conversion processing of the output voltage Vo, the CPU 16a performs voltage control and/or overcurrent control (steps S31 and S32). During voltage control, adjustment processing of the duty ratio is performed. During overcurrent control, as one example, outputting of a stop signal is performed based on the previous calculation result of the output current Iout. After this, the CPU 16a reflects the result of the voltage control and/or the overcurrent control on the PWM circuit 16g (step S33) and ends the interrupt processing.

As depicted in FIG. 13, when an interrupt occurs due to the end of AD conversion processing of the voltage Vsense, the CPU 16a calculates the output current based on Equation (23) (step S34) and ends the interrupt processing.

As described above, in the power supply 10 according to the first embodiment, the current detection circuit 14 detects the current from the detection tap 13b provided in the inductance element 13a, so that even when the inductance L increases, the detection error of the current iL can be reduced. As a result, the output current Iout is calculated accurately. The loss is also reduced for the reasons given earlier.

As depicted in FIG. 4, since the inductance element 13a is realized by the internal wiring of the circuit board 50 on which the current detection circuit 14 is mounted, it is possible to miniaturize the power supply 10.

By using α1, which is the output of the time constant circuit 18, the control circuit 16 may calculate Equation (23) in place of Equation (1). Equation (23) includes two multiplications and one subtraction, which reduces the amount of calculation in the control circuit 16 compared to Equation (1). This means that the output current Iout can be calculated efficiently.

Note that the control circuit 16 may calculate the output current Iout based on Equation (1). In this case, the time constant circuit 18 may be omitted.

Although the time constant circuit 18 outputs a value produced by filtering the control signal for controlling the switching element 12 in the example of the power supply 10 depicted in FIG. 1, the present embodiment is not limited to this. The time constant circuit 18 may output a value produced by filtering the control signal for controlling the switching element 11. For this configuration, the control signal for controlling the switching element 11 is inputted into one end of the resistance element 18a of the time constant circuit 18. When the amplitude of the control signal is 1 V, the output of the time constant circuit 18 is Vo/E. The reason why Vo/E is obtained by the time constant circuit 18 will now be described.

Figure 14:
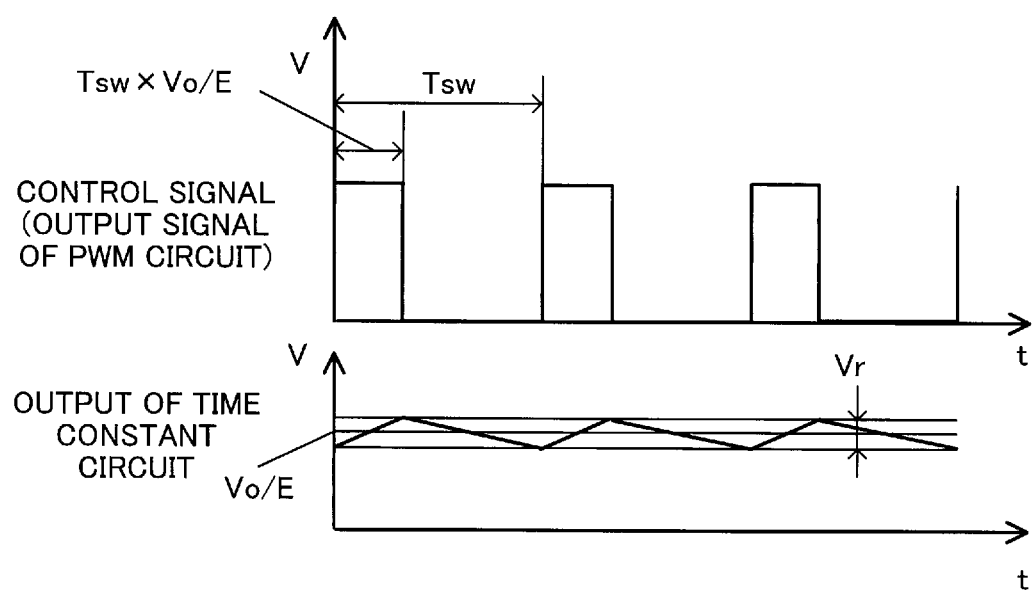
FIG. 14 depicts an example of a control signal outputted from the PWM circuit and the output of the time constant circuit.

FIG. 14 depicts an example of a control signal outputted from the PWM circuit and the output of the time constant circuit. The vertical axis represents voltage V and the horizontal axis represents time t.

FIG. 14 depicts an example of the control signal for the switching element 11 outputted from the PWM circuit 16g and the output of the time constant circuit 18. In FIG. 14, Tsw is the switching cycle. Vr is the ripple voltage of the output of the time constant circuit 18.

In the following description, it is assumed that the switching element 11 is turned on when the control signal is at the H level (for example, 1 V) and the switching element 11 is turned off when the control signal is at the L level (for example, 0 V).

The switching pulse width Ton2 of the switching element 11, that is, the time for which the switching element 11 is turned on, can be expressed as Equation (24) below in the step-down power supply 10.

$$Ton2 = D \cdot Tsw \qquad (24)$$

In Equation (24), D is the duty ratio. Since Vo=D×E, D=Vo/E. Accordingly, Equation (24) can be expressed as Equation (25).

$$Ton2 = (Vo/E) \cdot Tsw \qquad (25)$$

When a control signal with the switching pulse width Ton2 given by Equation (25) is inputted into the time constant circuit 18, a value close to the DC component of the control signal (that is, the average value of the control signal) is obtained by the low pass filter function. The average value of the control signal is a value obtained by dividing the integral of the control signal during a period of the switching pulse width Ton2 by the switching cycle Tsw. When it is assumed that the amplitude of the control signal is 1 V, since the integral is equal to Ton2 in Equation (25), when Ton2 is divided by the switching cycle Tsw, the average value becomes Vo/E. That is, a value close to Vo/E is obtained as the output of the time constant circuit 18.

Note that the method of designing the resistance of the resistance element 18a and/or the capacitance of the capacitance element 18b in the time constant circuit 18 to suppress the ripple voltage Vr is the same as the design method described earlier.

When it is assumed that (Vo/E), which as described above is the output of the time constant circuit 18, is α2, Equation (1) can be expressed as Equation (26).

$$Iout = Ipeak - (1-\alpha 2) \cdot k \cdot Vo \qquad (26)$$

Note that when the amplitude VA of the control signal outputted from the PWM circuit 16g is not 1 V, since a value obtained by multiplying (Vo/E) by the amplitude VA is outputted from the time constant circuit 18, α2 becomes α2=VA(Vo/E).

By using α2, which is the output of the time constant circuit 18, the control circuit 16 may calculate Equation (26) instead of Equation (1). Equation (26) includes two multiplications and two subtractions, and reduces the amount of calculation at the control circuit 16 compared to Equation (1). This means that the output current Iout can be calculated efficiently.

Second Embodiment

The following describes a power supply according to a second embodiment. In the power supply according to the second embodiment, an inductance element described below is used in place of the planar inductance element 13a depicted in FIGS. 4 and 5. The other elements are the same as in the power supply 10 according to the first embodiment.

Figure 15:
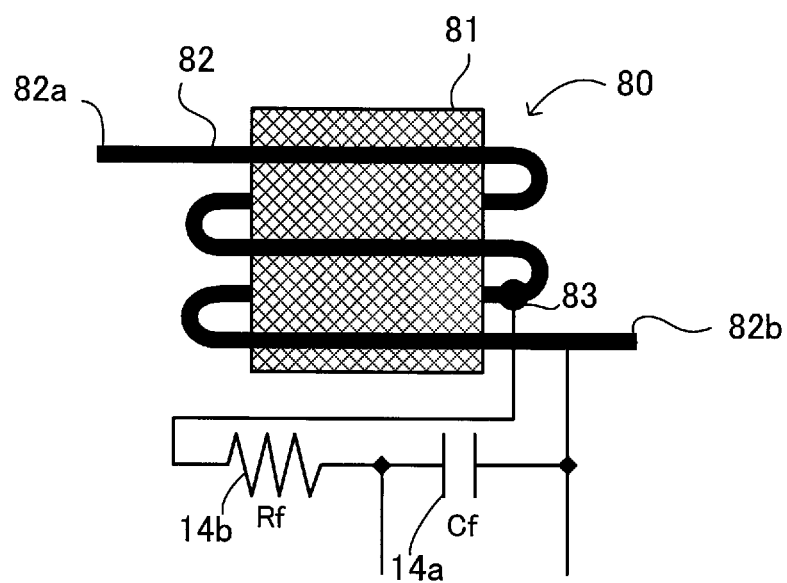
FIG. 15 depicts one example of an inductance element of a power supply according to a second embodiment.

FIG. 15 depicts one example of an inductance element of the power supply according to the second embodiment.

The inductance element 80 in the power supply according to the second embodiment is a coil where a winding 82 is wound around a core member 81, such as a ferrite core. One end 82a of the winding 82 is connected to the switching elements 11 and 12 depicted in FIG. 1, and the other end 82b of the winding 82 is connected to the output terminal OUT depicted in FIG. 1. In the inductance element 80, a detection tap 83 is provided at a position where the number of turns is Na from the output terminal OUT end (that is, the end 82b of the winding 82). Note that when the number of turns in the coil is expressed as N, N>Na. The detection tap 83 is connected to one end of the resistance element 14b of the current detection circuit 14 depicted in FIG. 1. That is, the detection tap 83 is pulled out from a position where the number of turns from the end 82b is Na. The end 82b is connected to the capacitance element 14a of the current detection circuit 14.

When the inductance element 80 described above is used, an equivalent circuit of the connections between the inductance element 80 and the current detection circuit 14 is the same as in FIG. 8.

When it is assumed that the inductance of the inductance element 80 is L and the resistance of the equivalent series resistance of the inductance element 80 is RL, the capacitance Cf of the capacitance element 14a and the resistance Rf of the resistance element 14b may satisfy the relationship in Equation (15). That is, Rf·Cf is Na/N times L/RL.

Accordingly, for the reasons described for the power supply 10 according to the first embodiment, the output current Iout can be accurately calculated and the loss can be reduced with the power supply 10 according to the second embodiment also.

Note that the use of an inductance element 80 like that depicted in FIG. 15 makes it possible to withstand a larger current than a configuration that uses the inductance element 13a depicted in FIGS. 4 and 5.

Third Embodiment

The following describes a power supply according to a third embodiment. In the power supply according to the third embodiment, the two inductance elements described below are used in place of the planar inductance element 13a depicted in FIGS. 4 and 5. The other elements are the same as in the power supply 10 according to the first embodiment.

Figure 16:
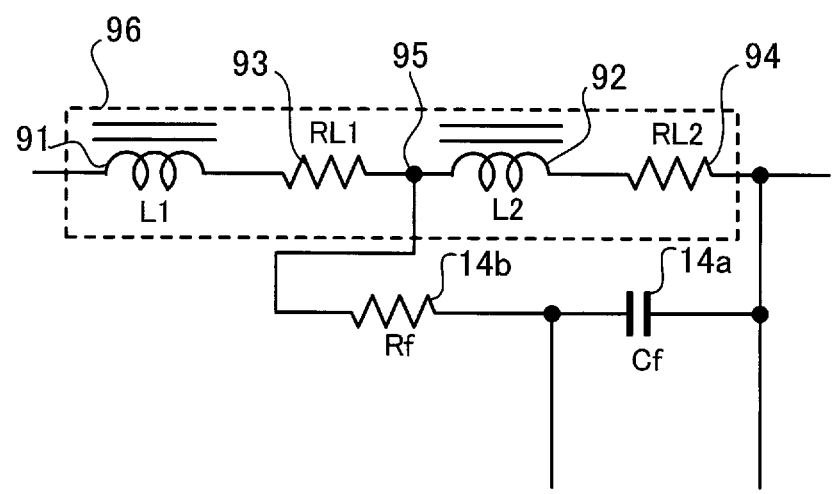
FIG. 16 depicts an example of inductance elements in a power supply according to a third embodiment.

FIG. 16 depicts an example of the inductance elements in the power supply according to the third embodiment.

The power supply according to the third embodiment includes two inductance elements 91 and 92 that are connected in series. In FIG. 16, an equivalent series resistance 93 of the inductance element 91 and an equivalent series resistance 94 of the inductance element 92 are also depicted.

One end of the inductance element 91 is connected to the switching elements 11 and 12 depicted in FIG. 1, and the other end is connected via the equivalent series resistance 93 to one end of the inductance element 92. The other end of the inductance element 92 is connected via the equivalent series resistance 94 to the output terminal OUT depicted in FIG. 1 and one end of the capacitance element 14a of the current detection circuit 14.

A detection tap 95 is connected to a connecting wire that connects the inductance elements 91 and 92. The detection tap 95 is connected to one end of the resistance element 14b of the current detection circuit 14.

Hereinafter, it is assumed that the inductance of the inductance element 91 is L1, the inductance of the inductance element 92 is L2, the resistance of the equivalent series resistance 93 is RL1, and the resistance of the equivalent series resistance 94 is RL2. It is also assumed that the capacitance of the capacitance element 14a is Cf and the resistance of the resistance element 14b is Rf.

When the inductance element 91 and the inductance element 92 are combined to form an inductance element 96, the inductance of the inductance element 96 is given as L=L1+L2, and the resistance of the equivalent series resistance is RL=RL1+RL2.

When these inductance elements 91 and 92 are used, Cf·Rf is set so as to satisfy the relationship L2/RL2=Cf·Rf to prevent the potential difference vc across both ends of the capacitance element 14a from depending on the frequency characteristics of the inductance element 92.

When it is assumed that the number of turns in the inductance element 92 is Na and the total number of turns in the inductance elements 91 and 92 is N, L2/RL2=(L·Na$^2$/N$^2$)/(RL·Na/N)=(Na/N)·(L/RL). This means that it is sufficient for Rf·Cf to satisfy the relationship in Equation (15). That is, Rf·Cf may be Na/N times L/RL.

Accordingly, for the reasons described above for the power supply 10 according to the first embodiment, the effects of improved calculation accuracy for the output current Iout and a reduction in the loss are also achieved by the power supply 10 according to the third embodiment.

Note that the inductance elements 91 and 92 described here may be realized by internal wiring of the circuit board on which the current detection circuit 14 is mounted. As depicted in FIG. 15, the inductance elements 91 and 92 may be realized by coils where a winding is wound around a core member.

Although several aspects of a power supply and a control method for a power supply according to the present embodiments have been described, the content given above provides mere examples to which the present embodiments are not limited.

According to the present embodiments, it is possible to accurately calculate an output current flowing to a load.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A power supply comprising:
   a first switching element that switches a current inputted from an input terminal;
   a second switching element that switches between a ground potential and an output of the first switching element;
   an inductance element that connects between an output terminal and the output of the first switching element and includes a detection terminal;
   a current detection circuit that outputs a voltage value based on a current flowing through the inductance element, the current detection circuit being connected to an output terminal end of the inductance element and to the detection terminal; and
   a control circuit that:
      controls a first control terminal of the first switching element and a second control terminal of the second switching element;
      converts the voltage value into a digital value when the voltage value reaches a peak;
      calculates a peak value of the current based on the digital value and a first resistance of an equivalent series resistance of the inductance element between the output terminal end and the detection terminal; and
      calculates an output current flowing to a load connected to the power supply based on the peak value.

2. The power supply according to claim 1, further comprising:
   a circuit board on which the current detection circuit is mounted,
   wherein the inductance element is realized by internal wiring of the circuit board.

3. The power supply according to claim 1, wherein the inductance element is a coil with N turns and the detection terminal is pulled out from a position that is Na (where N>Na) turns from the output terminal end of the inductance element.

4. The power supply according to claim 1, wherein the inductance element includes a first inductance element and a second inductance element and the detection terminal is connected to a connecting wire that connects the first inductance element and the second inductance element.

5. The power supply according to claim 1, further comprising:
   a time constant circuit into which one of a first control signal that controls the first control terminal and a second control signal that controls the second control terminal is inputted,
   wherein the control circuit calculates the output current based on an output of the time constant circuit and the peak value.

6. The power supply according to claim 1, wherein the control circuit detects whether the calculated output current is an overcurrent and controls the first control terminal and the second control terminal based on whether the output current is an overcurrent.

7. The power supply according to claim 1, wherein:
   the detection terminal is connected to one end of a series circuit composed of a resistance element and a capacitance element included in the current detection circuit; and
   a product of a resistance of the resistance element and a capacitance of the capacitance element is equal to a product of a first value, which is produced by dividing a first number of turns from the output terminal end of the inductance element to the detection terminal by a second number of turns in the entire inductance element, and a second value, which is produced by dividing an inductance of the inductance element by a second resistance of an equivalent series resistance of the inductance element.

8. A control method of a power supply, comprising:
   switching, by a first switching element included in the power supply, a current inputted from an input terminal;
   switching, by a second switching element included in the power supply, between a ground potential and an output of the first switching element;
   outputting, by a current detection circuit included in the power supply, a voltage value based on a current flowing through an inductance element connected between an output terminal and the output of the first switching element, the inductance element including a detection terminal, and the current detection circuit being connected to an output terminal end of the inductance element and to the detection terminal;

controlling, by a control circuit included in the power supply, a first control terminal of the first switching element and a second control terminal of the second switching element;

converting, by the control circuit, the voltage value into a digital value when the voltage value reaches a peak;

calculating, by the control circuit, a peak value of the current based on the digital value and a resistance of an equivalent series resistance of the inductance element between the output terminal end and the detection terminal; and calculating, by the control circuit, an output current flowing to a load connected to the power supply based on the peak value.

\* \* \* \* \*